(12) United States Patent
Chiou et al.

(10) Patent No.: US 9,734,909 B2
(45) Date of Patent: Aug. 15, 2017

(54) NON-VOLATILE STATIC RANDOM ACCESS MEMORY

(71) Applicant: National Cheng Kung University, Tainan (TW)

(72) Inventors: Lih-Yih Chiou, Tainan (TW); Tsai-Kan Chien, Tainan (TW); Yi-Sung Tsou, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 15/072,367

(22) Filed: Mar. 17, 2016

(65) Prior Publication Data
US 2016/0283149 A1    Sep. 29, 2016

(30) Foreign Application Priority Data
Mar. 24, 2015    (TW) .............................. 104109437 A

(51) Int. Cl.
| | | |
|---|---|---|
| G11C 14/00 | (2006.01) | |
| G06F 12/00 | (2006.01) | |
| G11C 13/00 | (2006.01) | |

(52) U.S. Cl.
CPC .......... G11C 14/0054 (2013.01); G06F 12/00 (2013.01); G11C 13/0069 (2013.01); G11C 14/009 (2013.01); G11C 14/0081 (2013.01); G11C 2013/0083 (2013.01)

(58) Field of Classification Search
CPC ............ G11C 14/0054; G11C 14/0081; G11C 13/0069; G11C 14/009; G11C 2013/0083; G11C 13/0002; G11C 11/4125
See application file for complete search history.

(56) References Cited

U.S. PATENT DOCUMENTS

| | | |
|---|---|---|
| 8,503,236 B2 | 8/2013 | Lee |
| 2004/0008542 A1 | 1/2004 | Sharma et al. |
| 2013/0070513 A1 | 3/2013 | Weiss et al. |
| 2013/0120925 A1 | 5/2013 | Park |
| 2014/0362635 A1 | 12/2014 | Erickson et al. |

FOREIGN PATENT DOCUMENTS

| | | |
|---|---|---|
| TW | I453745 | 9/2014 |
| WO | 2010093356 | 8/2010 |

*Primary Examiner* — Harry W Byrne
*Assistant Examiner* — Ajay Ojha
(74) *Attorney, Agent, or Firm* — Chieh-Mei Wang

(57) ABSTRACT

A non-volatile static random access memory has an operating mode, a data backup mode and a data restore mode. The non-volatile static random access memory includes a memory cell and a power saving module. The memory cell includes a latch, a set of latch switch units, a set of backup memory units, a set of backup activation units, a backup setting unit and a driving signal transmission unit. The power saving module includes a control switch unit, a backup determination unit and a restore switch unit. When backup data is different from data stored in the latch, a backup driving signal is generated by a node voltage of the backup memory units and outputted to a backup determination unit, which drives the backup setting unit to turn on according to the backup driving signal, so as to change the backup data in the backup memory units and ensure correct backup.

16 Claims, 14 Drawing Sheets

FIG. 1B

NON-VOLATILE STATIC RANDOM ACCESS MEMORY

TECHNICAL FIELD

The present invention relates to a non-volatile static random access memory, and more particularly to a non-volatile static random access memory which performs data backup only when backup data is different from stored data.

BACKGROUND

To conserve energy, today most of the portable, wearable, wireless sensor network and other electronic products are designed to be low in power consumption and compact in size. When the system end of a memory detects that the power supply is unstable or the system is about to enter a hibernation mode before the power is turned off, every piece of data in the memory must be backed up and stored in a backup memory element of a memory unit. However, data backup usually consumes a considerable amount of power. Therefore, unnecessary power waste may occur when backup data is already stored correctly in the backup memory element but is still being overwritten.

Moreover, when the power supply is unstable or the external power supply has a sudden power outage, the system would rely on the electric power pre-stored in the capacitor for system operations. Therefore, if backup data is already stored correctly in the backup memory element but is still overwritten, the remaining electric power would be wasted and the memory may store incorrect data once all the remaining power is run out before data backup is completed.

Therefore, there is a need to develop a non-volatile static random access memory capable of determining the need for data backup in advance. Thus, overwriting the same data is avoided when the backup data is up-to-date, and unnecessary power waste is minimized, so that the memory would contain sufficient power to perform data backup completely and correctly.

SUMMARY

One objective of the present invention is to provide a non-volatile static random access memory capable of determining whether the backup memory unit has stored correct data prior to data backup.

Another objective of the present invention is to provide a non-volatile static random access memory with minimized power consumption.

Still another objective of the present invention is to provide a non-volatile static random access memory capable of performing data backup completely and correctly.

The present invention provides a non-volatile static random access memory. The non-volatile static random access memory has an operating mode, a data backup mode and a data restore mode. The non-volatile static random access memory includes a memory cell and a power saving module. The memory cell is electrically coupled to a word line, a bit line, a complementary bit line, a backup signal line, a backup signal transmission line and a backup setting line. The memory cell includes a latch, a set of latch switch units, a set of backup memory units, a set of backup activation units, a backup setting unit and a driving signal transmission unit. When the latch switch unit is turned on by a signal transmitted by the word line under the operating mode and, the bit line and the complementary bit line are electrically coupled to the latch and data written by the bit line or the complementary bit line is received by and stored in the latch. The set of backup memory units have a node voltage. The backup memory units are electrically coupled to the backup signal transmission line and configured to store backup data. When the backup data is different from the data stored in the latch, a backup driving signal is generated by the node voltage of the backup memory units and outputted via the backup signal transmission line. The set of backup activation units are configured to electrically couple the backup memory unit to the latch when the backup activation units are turned on by a signal transmitted by the backup signal line under the data backup mode or the data restore mode. The backup memory units change the backup data according to a voltage level on the bit line and the data stored in the latch. The backup setting unit is configured to electrically couple the bit line to the backup memory units when the backup activation units are turned on under the data backup mode or the data restore mode. The driving signal transmission unit is electrically coupled between the backup signal transmission line and the backup memory unit and configured to enable the backup signal transmission line to transmit signals when the driving signal transmission unit is turned on under the data backup mode or the data restore mode. The power saving module is electrically coupled to the backup memory units via the backup signal transmission line and configured to receive the backup driving signal when the driving signal transmission unit is turned on. The power saving module includes a control switch unit, a backup determination unit and a restore switch unit. The control switch unit is configured to electrically couple the backup signal transmission line to a reference voltage when the control switch unit is turned on by the signal transmitted by the word line under the operating mode and configured to output the backup driving signal via the backup signal transmission line when being turned off under the data backup mode or in the data restore mode. The backup determination unit is configured to receive the backup driving signal transmitted by the backup signal transmission line and drive the backup setting unit to turn on according to the backup driving signal. The restore switch unit is configured to drive the backup setting unit to turn on under the data restore mode.

In summary, the present invention provides a non-volatile static random access memory. Prior to data backup, the backup determination unit determines whether the backup data stored in the backup memory units is correct. Specifically, data backup is performed only when the backup data is incorrect. Therefore, overwriting of the same data is prevented when the backup data is correct, so that unnecessary power waste is avoided and the memory would contain sufficient power to perform data backup completely and correctly.

BRIEF DESCRIPTION OF THE DRAWINGS

The present disclosure will become more readily apparent to those ordinarily skilled in the art after reviewing the following detailed description and accompanying drawings, in which:

FIG. 1B is a schematic circuit diagram of a non-volatile static random access memory and an associated power saving module in accordance with an embodiment of the present invention;

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
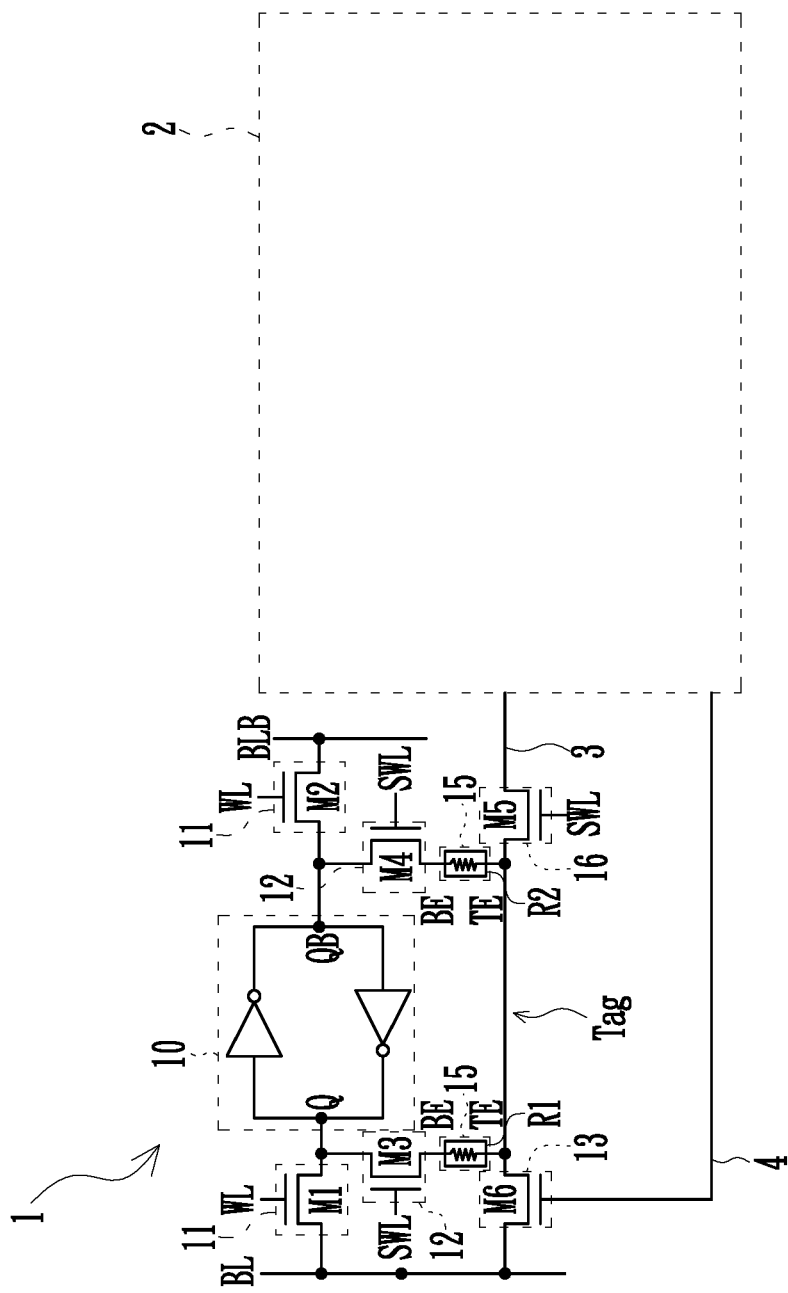
FIG. 1A is a schematic circuit diagram of a non-volatile static random access memory in accordance with an embodiment of the present invention.

FIG. 1A is a schematic circuit diagram of a non-volatile static random access memory in accordance with an embodiment of the present invention. The non-volatile static random access memory of the present embodiment has an operating mode, a data backup mode and a data restore mode. As shown in FIG. 1A, the non-volatile static random access memory of the present embodiment includes a memory cell 1 and a power saving module 2. The memory cell 1 is electrically coupled to a word line WL, a bit line BL, a complementary bit line BLB, a backup signal line SWL, a backup signal transmission line 3 and a backup setting line 4. The memory cell 1 includes a set of latch switch units 11, a latch 10, a set of backup activation units 12, a set of backup memory units 15, a backup setting unit 13 and a driving signal transmission unit 16.

Under the operating mode, the latch switch unit 11 is turned on by the signal transmitted by the word line WL and configured to electrically connect the bit line BL and the complementary bit line BLB to the latch 10; consequently, the latch 10 is configured to receive and store data written by the bit line BL or the complementary bit line BLB. The set of backup memory units 15 are electrically coupled to the backup signal transmission line 3 and configured to store backup data. When the backup data is different from the data stored in the latch 10, the backup memory units 15 are configured to generate a backup driving signal and output the backup driving signal via the backup signal transmission line 3. In the present embodiment, the backup memory units 15 include a first resistive memory element R1 and a second resistive memory element R2. The backup driving signal is also referred to as the node voltage Tag between the first resistive memory element R1 and the second resistive memory element R2. Both of the first resistive memory element R1 and the second resistive memory element R2 have a high resistance state and a low resistance state that are state switchable. When the setting terminals TE of the first resistive memory element R1 and the second resistive memory element R2 receive the data, the first resistive memory element R1 and the second resistive memory element R2 are in the low resistance state. Alternatively, when the resetting terminals BE of the first resistive memory element R1 and the second resistive memory element R2 receive the data, the first resistive memory element R1 and the second resistive memory element R2 are in the high resistance state.

The set of backup activation units 12 are turned on by the signal transmitted by the backup signal line SWL under the data backup mode or the data restore mode. The data written by the bit line BL is transmitted to the backup memory units 15 and the latch 10 via the backup activation units 12 in an ON-state. Consequently, the backup memory units 15 change the stored backup data according to the voltage level on the bit line BL and the data stored in the latch 10. The driving signal transmission unit 16 is electrically coupled between the backup signal transmission line 3 and the backup memory unit 15. When the driving signal transmission unit 16 is turned on under the data backup mode or the data restore mode, the backup signal transmission line 3 is enabled to transmit signals.

Figure 1B:
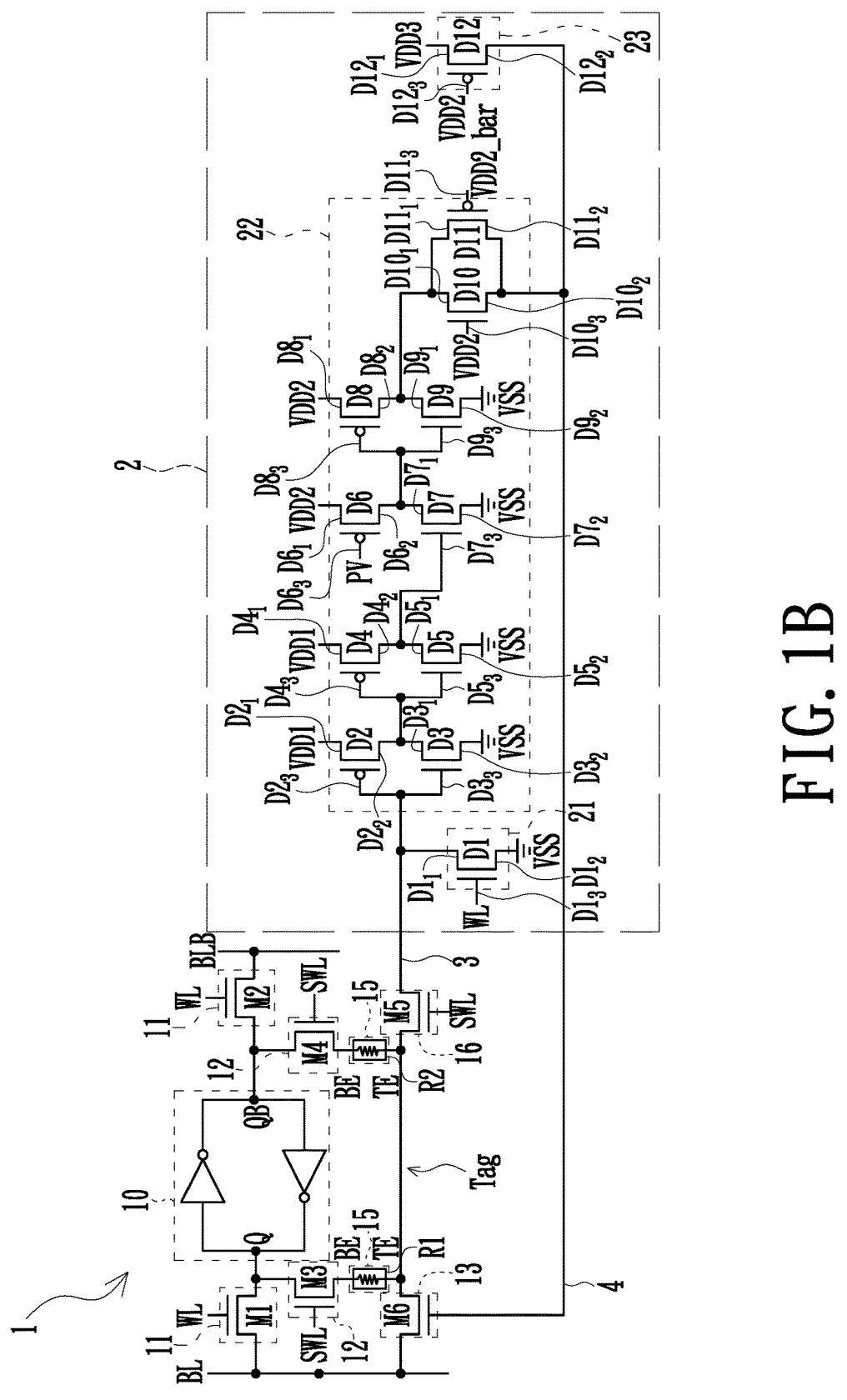

When the driving signal transmission unit 16 is turned on, the power saving module 2 is electrically connected to the backup memory units 15 via the backup signal transmission line 3 and configured to receive the backup driving signal. As shown in FIG. 1B, the power saving module 2 includes a control switch unit 21, a backup determination unit 22 and a restore switch unit 23. Under the operating mode, the control switch unit 21 is turned on by the signal transmitted by the word line WL and electrically connects the backup signal transmission line 3 to a reference voltage VSS; and therefore, the backup driving signal is discharged to the reference voltage VSS. Under the data backup mode or the data restore mode, the control switch unit 21 is turned off and the backup driving signal is outputted from the backup signal transmission line 3 to the backup determination unit 22. When receiving the backup driving signal, the backup determination unit 22 is configured to turn the backup setting unit 13 on or off according to the backup driving signal. Under the data restore mode, the restore switch unit 23 is configured to turn on the backup setting unit 13.

In the present embodiment, the latch switch unit 11 includes a first control transistor M1 and a second control transistor M2. The backup activation units 12 include a third control transistor M3 and a fourth control transistor M4. The driving signal transmission unit 16 includes a fifth control transistor M5. The backup setting unit 13 includes a sixth control transistor M6. Each of the transistors in the latch switch units 11, the backup activation units 12, the driving signal transmission unit 16 and the backup setting unit 13 has a first source/drain, a second source/drain and a gate. The latch 10 has a first transmission node Q and a second transmission node QB. Both of the first resistive memory element R1 and the second resistive memory element R2 have a setting terminal TE and a resetting terminal BE.

The gates $M1_3$ and $M2_3$ of the first control transistor M1 and the second control transistor M2 are electrically coupled to the word line WL. The first source/drain $M1_1$ and the second source/drain $M1_2$ of the first control transistor M1 are electrically coupled to the bit line BL and the first transmission node Q, respectively. The first source/drain $M2_1$ and the second source/drain $M2_2$ of the second control transistor M2 are electrically coupled to the second transmission node QB and the complementary bit line BLB, respectively.

The gates $M3_3$, $M4_3$ and $M5_3$ of the third control transistor M3, the fourth control transistor M4 and the fifth control transistor M5 are electrically coupled to the backup signal line SWL. The first source/drain $M3_1$ and the second source/drain $M3_2$ of the third control transistor M3 are electrically coupled to the first transmission node Q and the resetting terminal BE of the first resistive memory element R1, respectively. The first source/drain $M4_1$ and the second source/drain $M4_2$ of the fourth control transistor M4 are electrically coupled to the second transmission node QB and the resetting terminal BE of the second resistive memory element R2, respectively. The first source/drain $M5_1$ and the second source/drain $M5_2$ of the fifth control transistor M5 are electrically coupled to the setting terminal TE of the second resistive memory element R2 and the backup signal transmission line 3, respectively. The gate $M6_3$ of the sixth control transistor M6 is electrically coupled to the backup determination unit 22 and the restore switch unit 23 of the power saving module 2 via the backup setting line 4. The first source/drain $M6_1$ and the second source/drain $M6_2$ of the sixth control transistor M6 are electrically coupled to the bit line BL and the setting terminal TE of the first resistive memory element R1, respectively. The setting terminal TE of the first resistive memory element R1 and the setting terminal TE of the second resistive memory element R2 are electrically coupled to each other.

As shown in FIG. 1B, the control switch unit 21 includes a first power saving transistor D1. The backup determination unit 22 includes a second power saving transistor D2, a third power saving transistor D3, a fourth power saving transistor D4, a fifth power saving transistor D5, a sixth power saving transistor D6, a seventh power saving transistor D7, an eighth power saving transistor D8, a ninth power saving transistor D9, a tenth power saving transistor D10 and an eleventh power saving transistor D11. The restore switch unit 23 includes a twelfth power saving transistor D12. Each of the transistors in the control switch unit 21, the backup determination unit 22 and the restore switch unit 23 has a first source/drain, a second source/drain and a gate. In the present embodiment, the second, fourth, sixth, eighth, eleventh and twelfth power saving transistors are P-type transistors; and the first, third, fifth, seventh, ninth and tenth power saving transistors are N-type transistors.

The second sources/drains $D1_2$, $D3_2$, $D5_2$, $D7_2$ and $D9_2$ of the first power saving transistor D1, the third power saving transistor D3, the fifth power saving transistor D5, the seventh power saving transistor D7 and the ninth power saving transistor D9 are electrically coupled to the reference voltage VSS, respectively. The first sources/drains $D2_1$ and $D4_1$ of the second power saving transistor D2 and the fourth power saving transistor D4 are electrically coupled to a first voltage source VDD1, respectively. The first sources/drains $D6_1$ and $D8_1$ of the sixth power saving transistor D6 and the eighth power saving transistor D8 are electrically coupled to a second voltage source VDD2, respectively. The gates $D10_3$ and $D12_3$ of the tenth power saving transistor D10 and the twelfth power saving transistor D12 are electrically coupled to the second voltage source VDD2, respectively. The gate $D11_3$ of the eleventh power saving transistor D11 is electrically coupled to a reversed voltage source VDD2_bar. The gates $D2_3$ and $D3_3$ of the second power saving transistor D2 and the third power saving transistor D3 are electrically coupled to the backup signal transmission line 3, respectively. The second source/drain $D2_2$ of the second power saving transistor D2 and the first source/drain $D3_1$ of the third power saving transistor D3 are electrically coupled to the gate $D4_3$ of the fourth power saving transistor D4 and the gate $D5_3$ of the fifth power saving transistor D5. The second source/drain $D4_2$ of the fourth power saving transistor D4 and the first source/drain $D5_1$ of the fifth power saving transistor D5 are electrically coupled to the gate $D7_3$ of the seventh power saving transistor D7. The gate $D6_3$ of the sixth power saving transistor D6 is electrically coupled to a pre-charging signal PV. The second source/drain $D6_2$ of the sixth power saving transistor D6 and the first source/drain $D7_1$ of the seventh power saving transistor D7 are electrically coupled to the gate $D8_3$ of the eighth power saving transistor D8 and the gate $D9_3$ of the ninth power saving transistor D9. The second source/drain $D8_2$ of the eighth power saving transistor D8 and the first source/drain $D9_1$ of the ninth power saving transistor D9 are electrically coupled to the first source/drain $D10_1$ of the tenth power saving transistor D10 and first source/drain $D11_1$ of the eleventh power saving transistor D11. The second source/drain $D10_2$ of the tenth power saving transistor D10 and the second source/drain $D11_2$ of the eleventh power saving transistor D11 are electrically coupled to the gate $M6_3$ of the sixth control transistor M6 of the backup setting unit 13. The first source/drain $D12_1$ of the twelfth power saving transistor D12 is electrically coupled to a third voltage source VDD3. The second source/drain $D12_2$ of the twelfth power saving transistor D12 is electrically coupled to the gate $M6_3$ of the sixth control transistor M6 of the backup setting unit 13.

Figure 2:
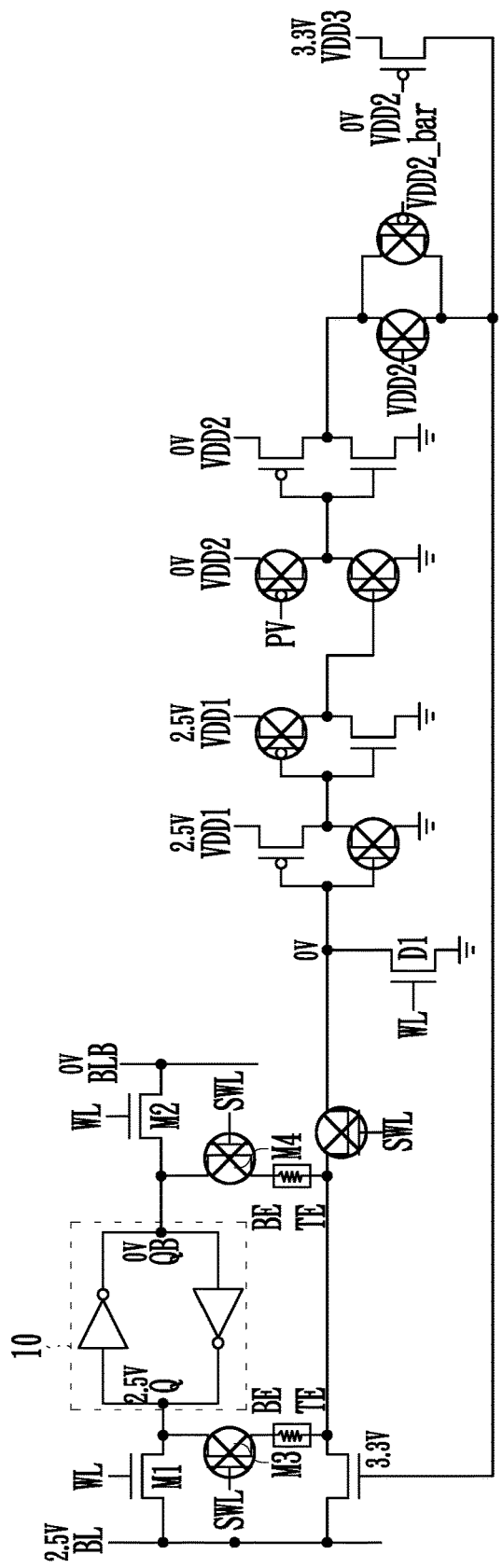
FIG. 2 is a schematic circuit diagram of a non-volatile static random access memory of FIGS. 1A and 1B storing a data format under an operating mode in accordance with an embodiment of the present invention.
Figure 3:
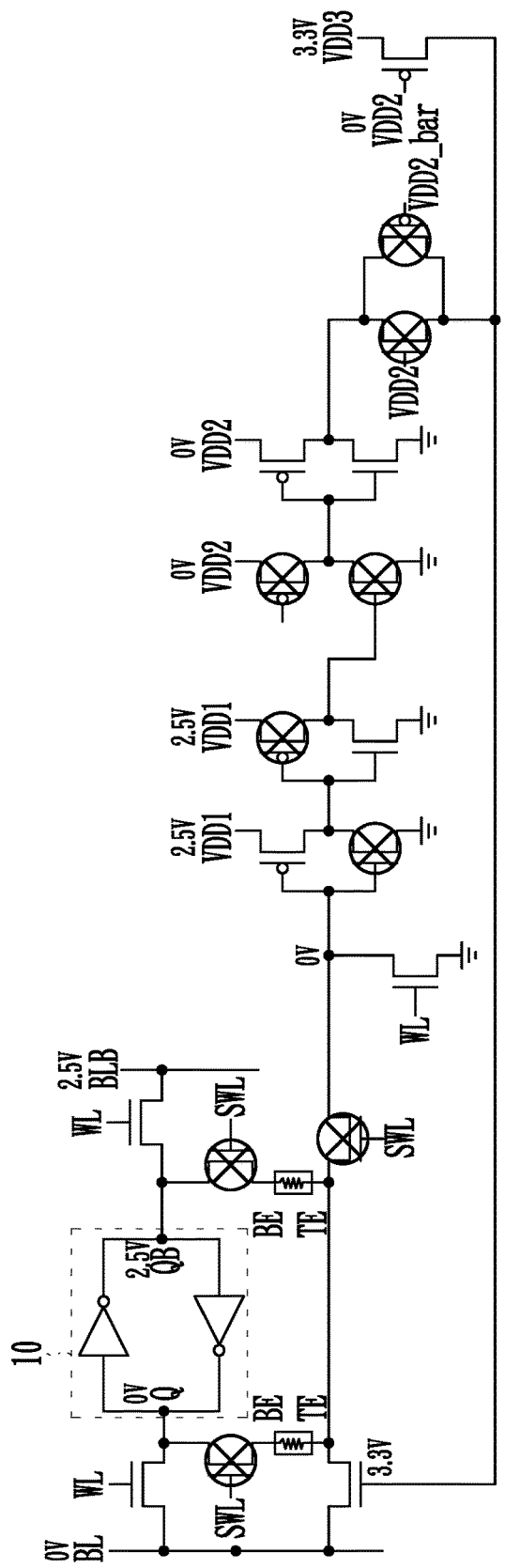
FIG. 3 is a schematic circuit diagram of a non-volatile static random access memory of FIGS. 1A and 1B storing another data format under the operating mode in accordance with an embodiment of the present invention.

FIG. 2 is a schematic circuit diagram of a non-volatile static random access memory in an operating mode in accordance with an embodiment of the present invention. Under the operating mode, the first control transistor M1, the second control transistor M2 and the first power saving transistor D1 are turned on by the signal transmitted by the word line WL; the third control transistor M3 and the fourth control transistor M4 are turned off. Before the data is written, the bit line BL and the complementary bit line BLB are pre-charged; either the bit line BL or the complementary bit line BLB selected by the writing path is discharged; and the data is written into the latch 10. In addition, when reading data, the bit line BL and the complementary bit line BLB need to be pre-charged; the discharging path is determined according to the data stored in the latch 10 and is provided to the related sensing amplifier (not shown) for the data reading. When the write data is 1 as exemplified in FIG. 2, the first transmission node Q of the latch 10 is 1 and the second transmission node QB is 0. When the write data is 0 as exemplified in FIG. 3, the first transmission node Q of the latch 10 is 0 and the second transmission node QB is 1.

Figure 4:
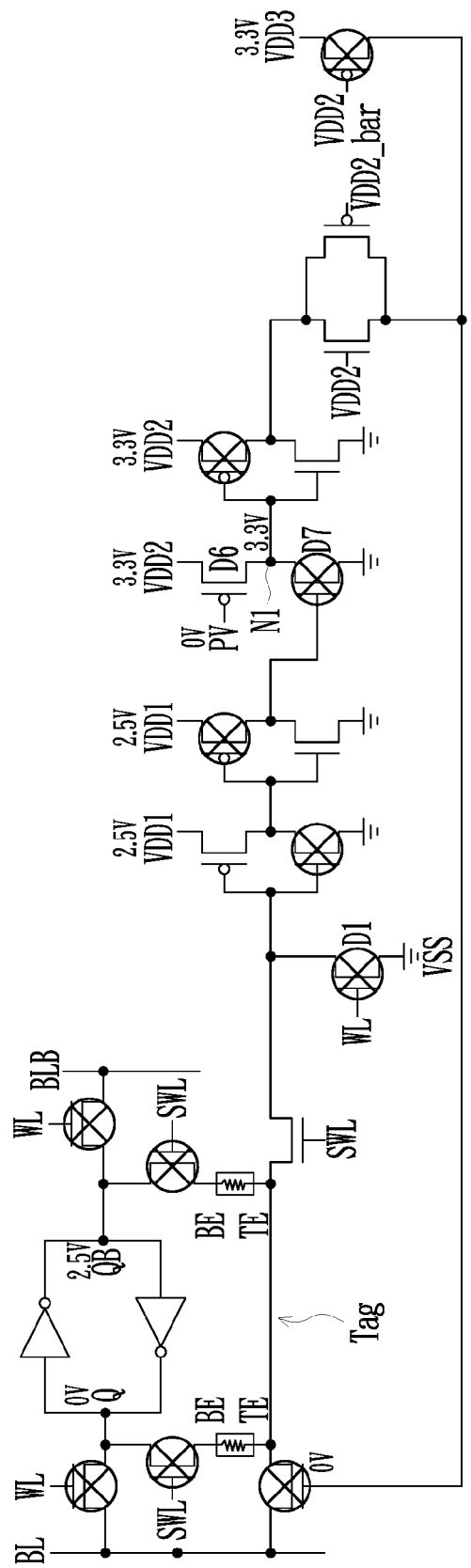
FIG. 4 is a schematic circuit diagram of the non-volatile static random access memory of FIGS. 1A and 1B performing a data backup determination before entering the data backup mode in accordance with an embodiment of the present invention.
Figure 5:
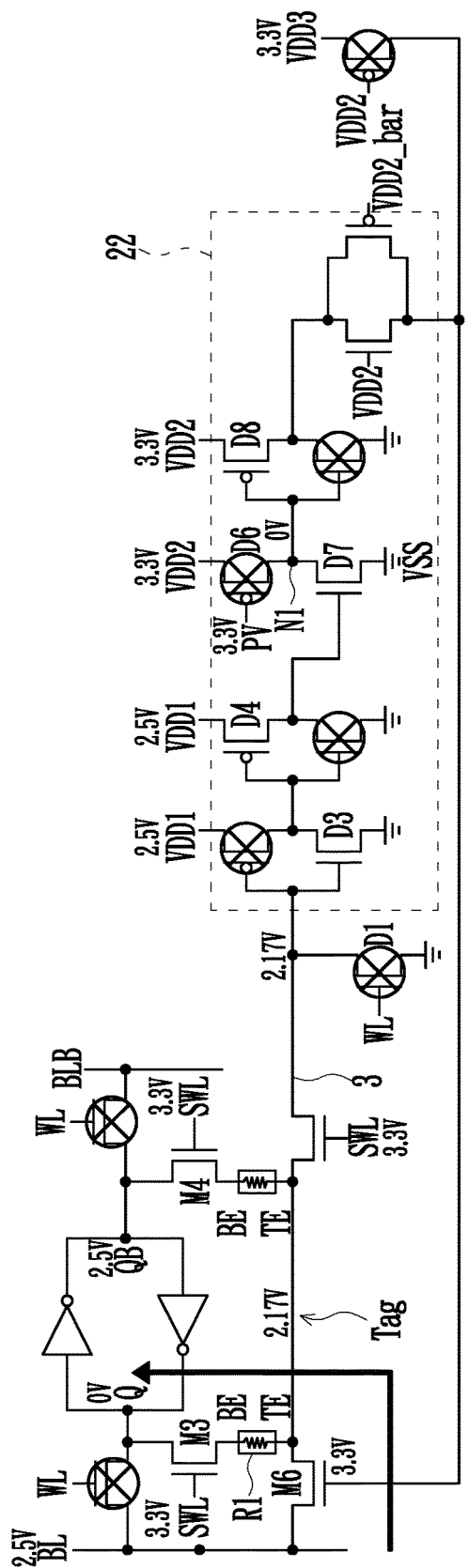
FIG. 5 is a schematic circuit diagram of the non-volatile static random access memory of FIG. 4 using the first resistive memory element of the backup memory units to store data when determining that data backup is necessary under the data backup mode in accordance with an embodiment of the present invention.

Before entering the data backup mode as shown in FIG. 4, a voltage signal of 0 V is provided by the pre-charging signal PV; the P-typed sixth power saving transistor D6 is turned on; and the node N1 between the sixth power saving transistor D6 and the seventh power saving transistor D7 is pre-charged to a charging voltage (3.3 V) by the second power source VDD2. Thereafter, under the data backup mode as shown in FIG. 5, the first power saving transistor D1 is turned off; the electrical conduction between the backup signal transmission line 3 and the reference voltage VSS is released; the node voltage Tag between the first resistive memory element R1 and the second resistive memory element R2 is transmitted to the backup determination unit 22; and the backup determination unit 22 determines whether data backup is necessary. The node voltage Tag has a high level and a low level. Specifically, the node voltage Tag has a high level when the data written into the latch 10 is different from the backup data stored in the backup memory unit 15. Alternatively, the node voltage Tag has a low level when the data written into the latch 10 is identical to the backup data stored in the backup memory unit 15. Therefore, the backup determination unit 22 can drive the sixth power saving transistor D6 of the backup setting unit 13 to turn on according to the high level of the node voltage Tag and drive the sixth power saving transistor D6 of the backup setting unit 13 to turn off according to the low level of the node voltage Tag.

Figure 6:
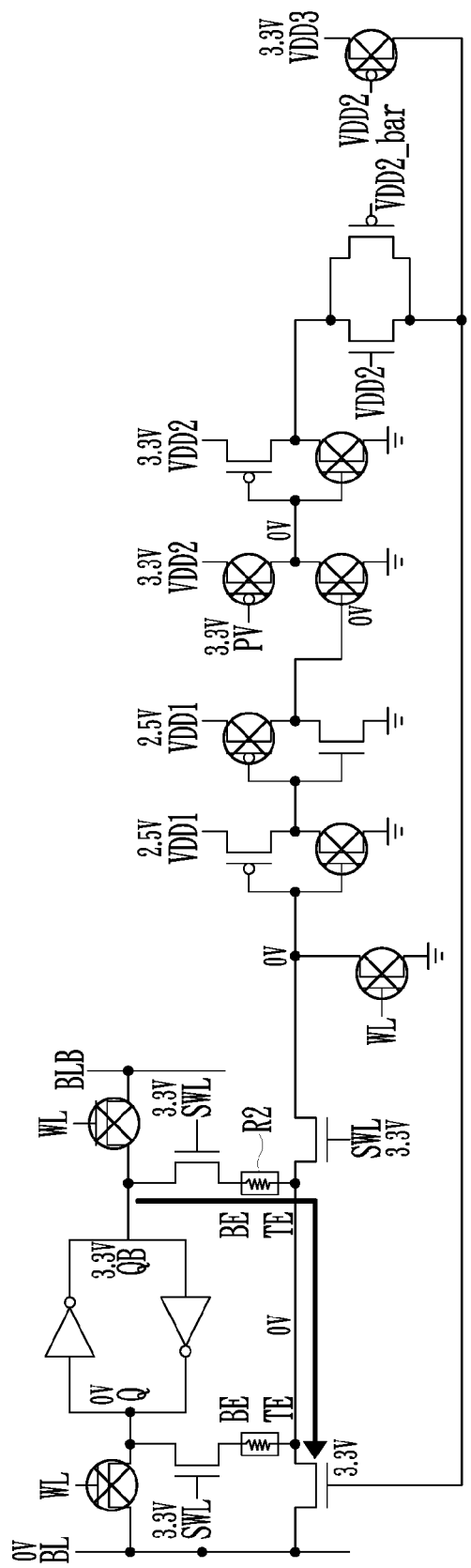
FIG. 6 is a schematic circuit diagram of the non-volatile static random access memory of FIG. 4 using the second resistive memory element of the backup memory units to store data under the data backup mode in accordance with an embodiment of the present invention.

In the present embodiment as shown in FIG. 5, the high level of the node voltage Tag is 2.17 V. Therefore, the third power saving transistor D3 and the fourth power saving transistor D4 are turned on; and the seventh power saving transistor D7 is turned on by the first voltage source VDD1 (e.g., 2.5 V). At this time, the original pre-charging signal PV is 3.3 V. As the P-typed sixth power saving transistor D6 is turned off, the charging voltage of the node N1 is discharged to the reference voltage VSS by the seventh power saving transistor D7 and drops to 0 V. Since the discharge control of the node N1 is determined by the low and high levels of the node voltage Tag, discharge of the node N1 is represents that the write data is different from the backup data and data backup is required. Therefore, the third control transistor M3, the fourth control transistor M4, and the sixth power saving transistor D6 of the backup activation units 12 are turned on; the write data (2.5 V) on the bit line BL is received by the setting terminal TE of the first resistive memory element R1 and outputted to the first transmission node Q from the resetting terminal BE thereof; and the resistance state of the first resistive memory element R1 is set. Thereafter, as shown in FIG. 6, the input voltage is decreased to 0 V by the bit line BL; data is transmitted from the second transmission node QB to the resetting terminal BE of the second resistive memory element R2; and the resistance state of the second resistive memory element R2 is set.

Figure 7:
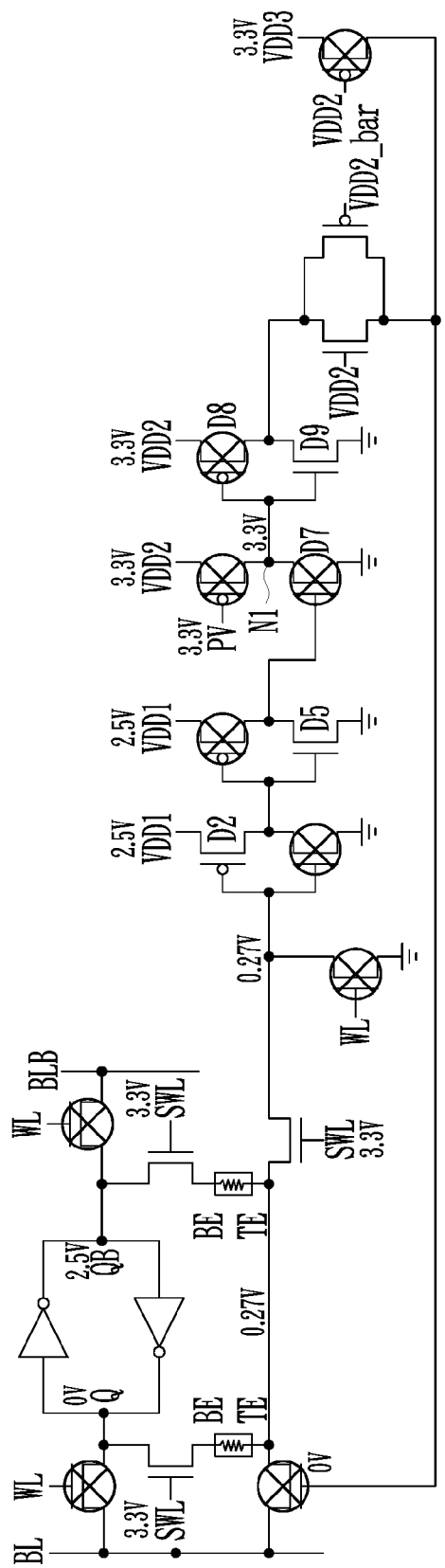
FIG. 7 is a schematic circuit diagram of the non-volatile static random access memory of FIG. 4 when determining that data backup is unnecessary under the data backup mode in accordance with an embodiment of the present invention.

A low level of the node voltage Tag indicates that data backup is not required. As shown in FIG. 7, the second power saving transistor D2 and the fifth power saving transistor D5 are turned on; the seventh power saving transistor D7 is turned off; the charging voltage of the node N1 is not discharged; the eighth power saving transistor D8 is turned off and the ninth power saving transistor D9 is turned on by the charging voltage of the node N1; the second voltage source VDD2 stops being outputted to the sixth control transistor M6; the sixth control transistor M6 is turned off; and the first resistive memory element R1 and the second resistive memory element R2 are maintained at the original state.

Figure 8:
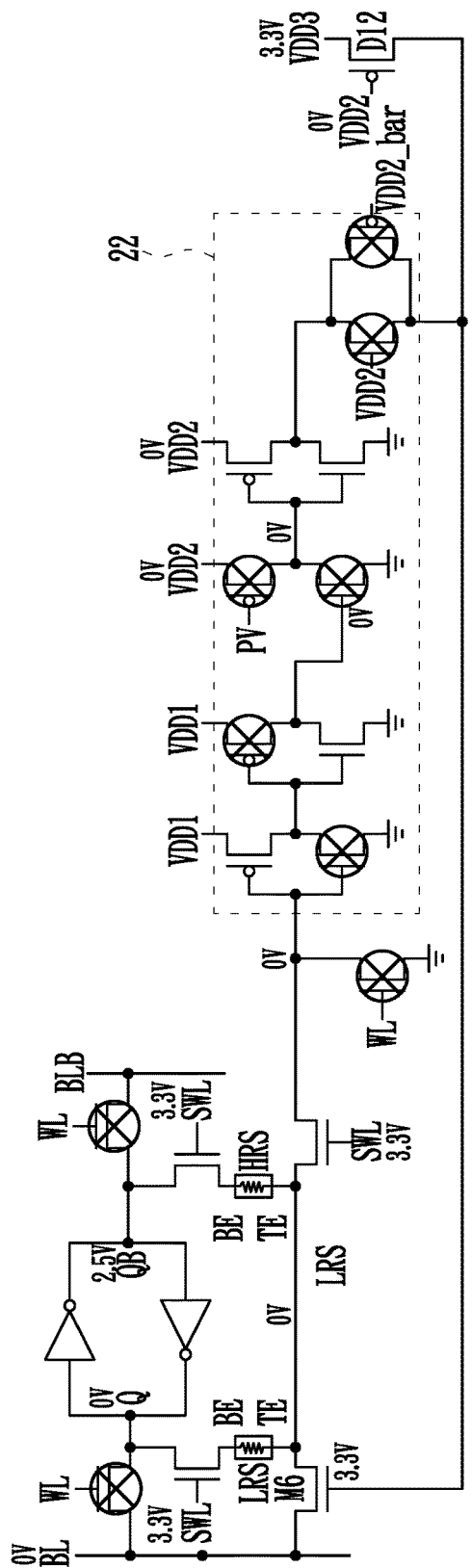
FIG. 8 is a schematic circuit diagram of the non-volatile static random access memory of FIGS. 1A and 1B under a data restore mode in accordance with an embodiment of the present invention.

After the data backup mode is ended, the non-volatile static random access memory of the present embodiment is switched to a hibernation state and all of the switch units remain undriveable until the non-volatile static random access memory is switched back to the data backup mode from the hibernation state. In the data backup mode as shown in FIG. 8, the twelfth power saving transistor D12 is turned on by the third voltage source VDD3; the third voltage source VDD3 is transmitted to the sixth control transistor M6; and the sixth control transistor M6 is turned on.

Figure 9:
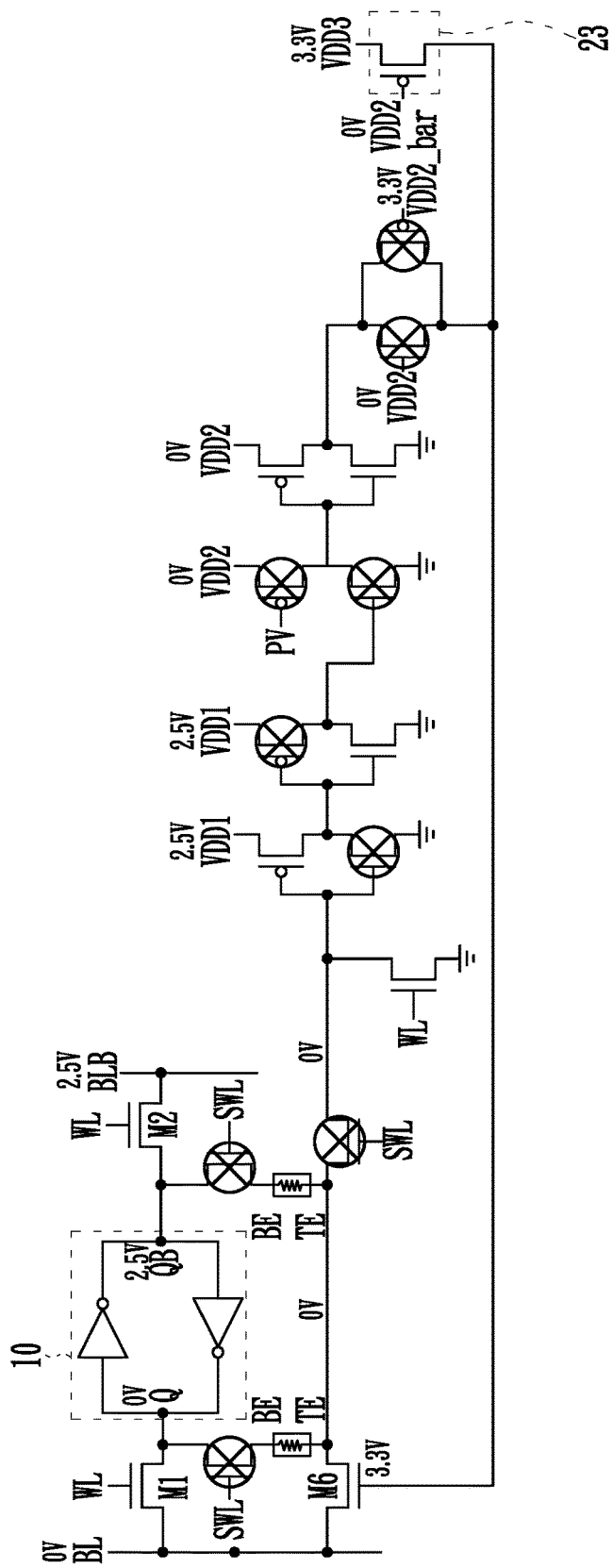
FIG. 9 is a schematic circuit diagram of the non-volatile static random access memory of FIGS. 1A and 1B before a forming mode in accordance with an embodiment of the present invention.
Figure 10:
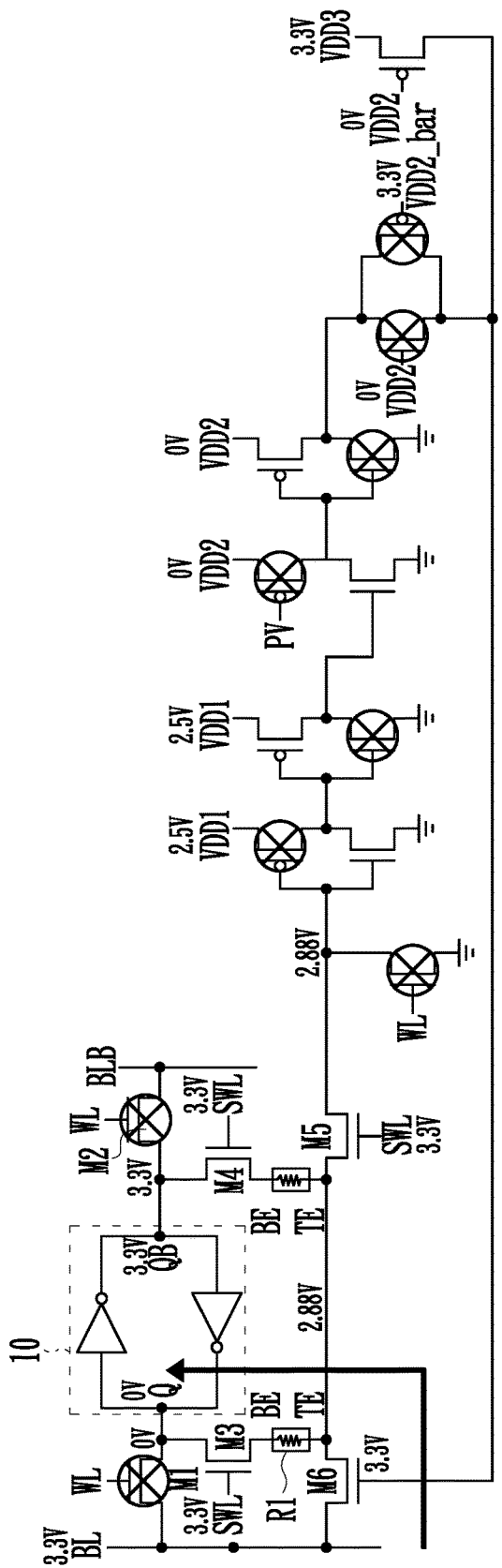
FIG. 10 is a schematic circuit diagram of the non-volatile static random access memory of FIG. 9 forming the first resistive memory element under the forming mode in accordance with an embodiment of the present invention.
Figure 11:
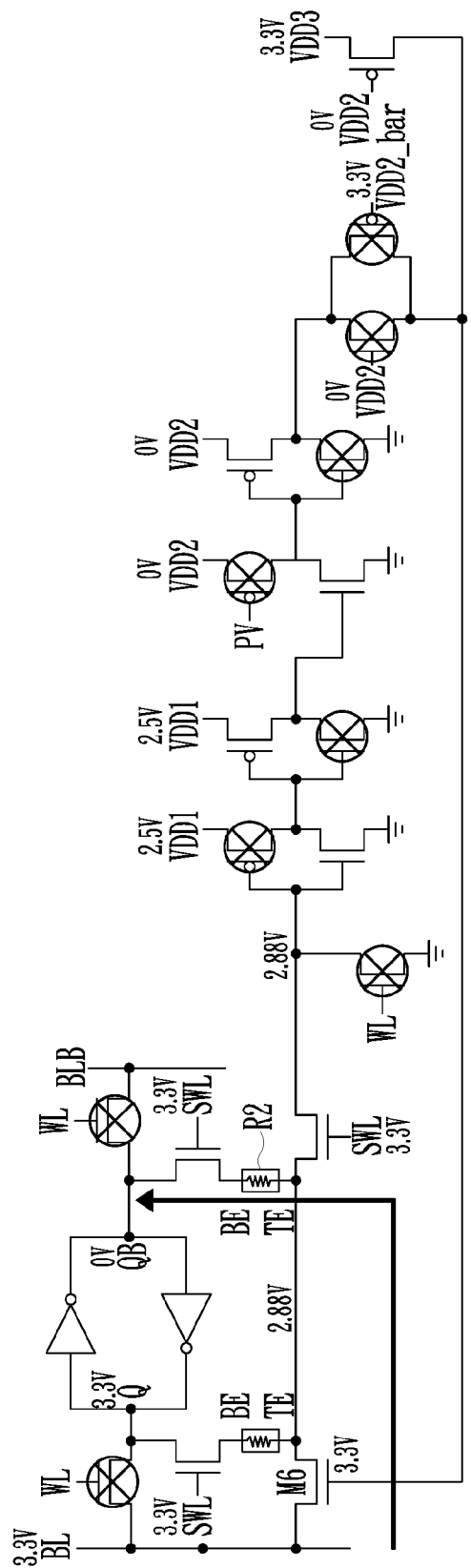
FIG. 11 is a schematic circuit diagram of the non-volatile static random access memory of FIG. 9 forming the second resistive memory element under the forming mode in accordance with an embodiment of the present invention.

The non-volatile static random access memory of the present embodiment is exemplified by a resistive random access memory (RRAM). To allow normal functioning of the memory, the non-volatile resistive static random access memory further includes a forming mode and an initiating mode, before entering the operating mode. As shown in FIG. 9, in the forming mode, the first control transistor M1 and the second control transistor M2 are turned on by the signal transmitted by the word line WL; the sixth control transistor M6 is turned on by the signal transmitted by the restore switch unit 23; the latch 10 receives, from the second transmission node QB, the data written by the complementary bit line BLB; and the data is outputted from the bit line BL via the first transmission node Q. Thereafter, as shown in FIG. 10, the first control transistor M1 and the second control transistor M2 are turned off; the third control transistor M3, the fourth control transistor M4 and the fifth control transistor M5 are turned on by the signal transmitted by the backup signal line SWL; the data written by the bit line BL is transmitted via the sixth control transistor M6 in an ON-state; the data is received by the setting terminal TE of the first resistive memory element R1 and outputted by the resetting terminal BE; thereafter, the data is transmitted to the first transmission node Q of the latch 10 via the third control transistor M3 in an ON-state. Thus, the forming of the first resistive memory element R1 is completed. As shown in FIG. 11, which provides an opposite example of FIG. 9, data of 2.5 V is written into the first transmission node Q and data of 0V is written into the second transmission node QB; the data written by the bit line BL is received by the setting terminal TE of the second control transistor M2, outputted by the resetting terminal BE, and transmitted to the second transmission node QB of the latch 10 via the fourth control transistor M4 in an ON-state and written into the first transmission node Q. Thus, the forming of the second resistive memory element R2 is completed, and both of the first resistive memory element R1 and the second resistive memory element R2 are in the low resistance state.

Figure 12:
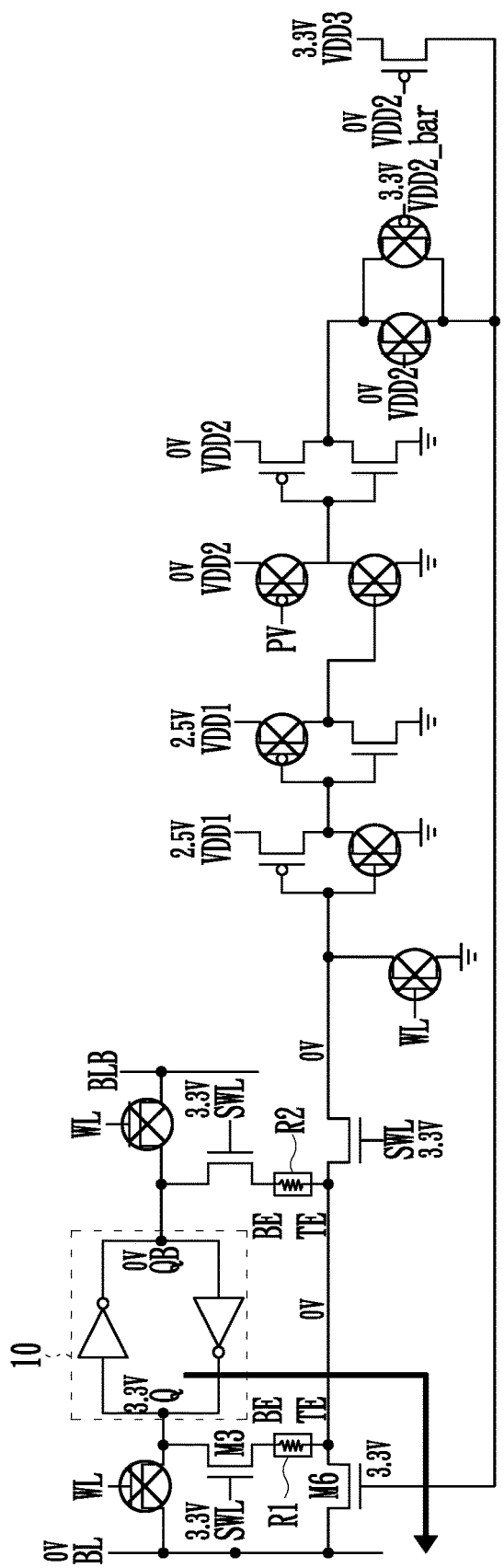
FIG. 12 is a schematic circuit diagram of the non-volatile static random access memory of FIGS. 1A and 1B under an initiating mode in accordance with an embodiment of the present invention.

Next, the initiating mode is performed. As shown in FIG. 12, the voltage on the bit line BL drops to 0 V when the first resistive memory element R1 and the second resistive memory element R2 receive data via the setting terminals TE thereof and are in a low resistance state. Thus, the data written into the first transmission node Q of the latch 10 is transmitted to the resetting terminal BE of the first resistive memory element R1 via the third transistor M3 in an ON-state, outputted from the setting terminal TE, and discharged when transmitted to the bit line BL via the sixth control transistor M6 in an ON-state. Therefore, the first resistive memory element R1 is switched into the high resistance state, whereas the second resistive memory element R2 is still in the low resistance state. As a result, the first resistive memory element R1 and the second resistive memory element R2 have complementary resistances and the memory of the present embodiment can operate normally.

Figure 13:
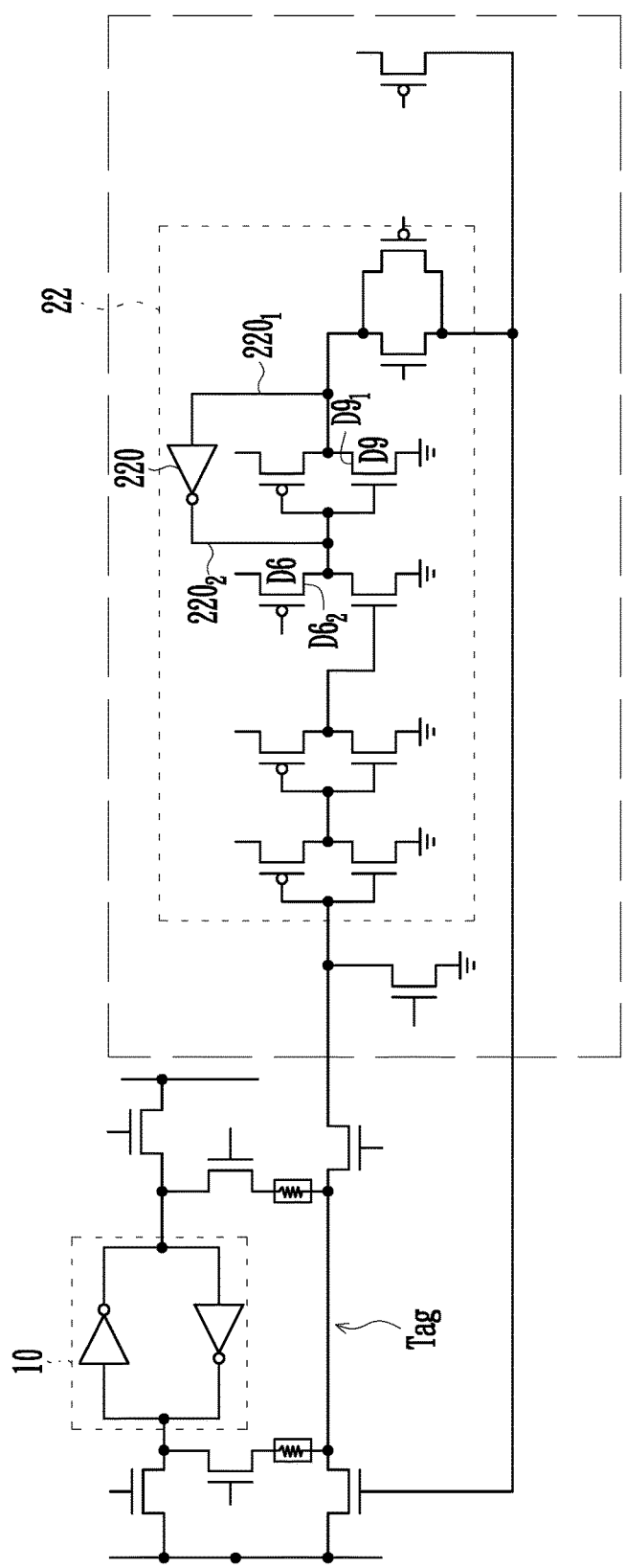
FIG. 13 is a schematic circuit diagram of a non-volatile static random access memory in accordance with another embodiment of the present invention.

FIG. 13 is a schematic circuit diagram of a non-volatile static random access memory in accordance with another embodiment of the present invention. As shown, the backup determination unit 22 of the present embodiment further includes a feedback inverter 220. The feedback inverter 220 includes an input terminal $220_1$ and an output terminal $220_2$. The input terminal $220_1$ is electrically coupled to the first source/drain $D9_1$ of the ninth power saving transistor D9. The output terminal $220_2$ is electrically coupled to the second source/drain $D6_2$ of the sixth power saving transistor D6. When the backup determination unit 22 determines that the backup operation is not necessary according to the node voltage Tag, the feedback inverter 220 is configured to latch the charges of the second source/drain $D6_2$ of the sixth power saving transistor D6. In the present embodiment, the driving capacity of the feedback inverter 220 is lower than that of the eighth power saving transistor D8 and the ninth power saving transistor D9; therefore, the second source/drain $D6_2$ of the sixth power saving transistor D6 would not be affected and may discharge normally.

In summary, the present invention provides a non-volatile static random access memory. Prior to data backup, the backup determination unit determines whether the backup data stored in the backup memory unit is correct. Specifically, the data backup is performed only when the backup data is incorrect. Therefore, overwriting the same data is avoided when the backup data is correct, so that unnecessary power waste is minimized and the memory would contain sufficient power to perform data backup completely and correctly.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile static random access memory having an operating mode, a data backup mode and a data restore mode, the non-volatile static random access memory comprising:
    a memory cell, electrically coupled to a word line, a bit line, a complementary bit line, a backup signal line, a backup signal transmission line and a backup setting line, the memory cell comprising:
        a latch;
        a set of latch switch units, wherein when the latch switch units are turned on by a signal transmitted by the word line under the operating mode, the bit line and the complementary bit line are electrically coupled to the latch and data written by the bit line or the complementary bit line is received by and stored in the latch;
        a set of backup memory units having a node voltage, wherein the backup memory units are electrically coupled to the backup signal transmission line and configured to store backup data, wherein when the backup data is different from the data stored in the latch, a backup driving signal is generated by the node voltage of the backup memory units and outputted via the backup signal transmission line;
        a set of backup activation units, configured to electrically couple the backup memory unit to the latch when the backup activation unit is turned on by a signal transmitted by the backup signal line under the data backup mode or the data restore mode, wherein the backup memory units change the backup data according to a voltage level on the bit line and the data stored in the latch;
        a backup setting unit, configured to electrically couple the bit line to the backup memory units when the backup activation units are turned on under the data backup mode or the data restore mode; and
        a driving signal transmission unit, electrically coupled between the backup signal transmission line and the backup memory unit and configured to enable the backup signal transmission line to transmit signals when the driving signal transmission unit is turned on under the data backup mode or the data restore mode; and
    a power saving module, electrically coupled to the backup memory units via the backup signal transmission line and configured to receive the backup driving signal when the driving signal transmission unit is turned on, the power saving module comprising:
        a control switch unit, configured to electrically couple the backup signal transmission line to a reference voltage when the control switch unit is turned on by the signal transmitted by the word line under the operating mode and configured to output the backup driving signal via the backup signal transmission line when being turned off under the data backup mode or in the data restore mode;
        a backup determination unit, configured to receive the backup driving signal transmitted by the backup signal transmission line and turn on the backup setting unit according to the backup driving signal; and
        a restore switch unit, configured to turn on the backup setting unit under the data restore mode.

2. A non-volatile static random access memory having an operating mode, a data backup mode and a data restore mode, the non-volatile static random access memory comprising:
    a memory cell, electrically coupled to a word line, a bit line, a complementary bit line, a backup signal line, a backup signal transmission line and a backup setting line, the memory cell comprising:
        a latch;
        a set of latch switch units, wherein when the latch switch units are turned on by a signal transmitted by the word line under the operating mode, the bit line and the complementary bit line are electrically coupled to the latch and data written by the bit line or the complementary bit line is received by and stored in the latch;
        a set of backup memory units having a node voltage, wherein the backup memory units are electrically coupled to the backup signal transmission line and configured to store backup data, wherein when the backup data is different from the data stored in the latch, a backup driving signal is generated by the node voltage of the backup memory units and outputted via the backup signal transmission line, the set of backup memory units comprise a first resistive memory element and a second resistive memory element, and the backup driving signal is the node voltage between the first resistive memory element and the second resistive memory element;

a set of backup activation units, configured to electrically couple the backup memory unit to the latch when the backup activation unit is turned on by a signal transmitted by the backup signal line under the data backup mode or the data restore mode, wherein the backup memory units change the backup data according to a voltage level on the bit line and the data stored in the latch;

a backup setting unit, configured to electrically couple the bit line to the backup memory units when the backup activation units are turned on under the data backup mode or the data restore mode; and a driving signal transmission unit, electrically coupled between the backup signal transmission line and the backup memory unit and configured to enable the backup signal transmission line to transmit signals when the driving signal transmission unit is turned on under the data backup mode or the data restore mode; and a power saving module, electrically coupled to the backup memory units via the backup signal transmission line and configured to receive the backup driving signal when the driving signal transmission unit is turned on, the power saving module comprising:

a control switch unit, configured to electrically couple the backup signal transmission line to a reference voltage when the control switch unit is turned on by the signal transmitted by the word line under the operating mode and configured to output the backup driving signal via the backup signal transmission line when being turned off under the data backup mode or in the data restore mode;

a backup determination unit, configured to receive the backup driving signal transmitted by the backup signal transmission line and turn on the backup setting unit according to the backup driving signal; and a restore switch unit, configured to turn on the backup setting unit under the data restore mode.

3. The non-volatile static random access memory according to claim 2, wherein the set of latch switch units comprise a first control transistor and a second control transistor, the set of backup activation units comprise a third control transistor and a fourth control transistor, the driving signal transmission unit comprises a fifth control transistor, the backup setting unit comprises a sixth control transistor, the first control transistor and the second control transistor in the latch switch units, the third control transistor and the fourth control transistor in the backup activation units, the fifth control transistor in the driving signal transmission unit and the sixth control transistor in the backup setting unit each has a first source/drain, a second source/drain and a gate, the latch has a first transmission node and a second transmission node, the first resistive memory element and the second resistive memory element each has a setting terminal and a resetting terminal, wherein the gate of the first control transistor and the gate of the second control transistor are electrically coupled to the word line, the first source/drain and the second source/drain of the first control transistor are electrically coupled to the bit line and the first transmission node respectively, the first source/drain and the second source/drain of the second control transistor are electrically coupled to the second transmission node and the complementary bit line respectively, wherein the gate of the third control transistor, the gate of the fourth control transistor and the gate of the fifth control transistor are electrically coupled to the backup signal line, the first source/drain and the second source/drain of the third control transistor are electrically coupled to the first transmission node and the resetting terminal of the first resistive memory element respectively, the first source/drain and the second source/drain of the fourth control transistor are electrically coupled to the second transmission node and the resetting terminal of the second resistive memory element respectively, the first source/drain and the second source/drain of the fifth control transistor are electrically coupled to the setting terminal of the second resistive memory element and the backup signal transmission line respectively, wherein the gate of the sixth control transistor is electrically coupled to the backup determination unit and the restore switch unit of the power saving module, the first source/drain and the second source/drain of the sixth control transistor are electrically coupled to the bit line and the setting terminal of the first resistive memory element respectively, wherein the setting terminal of the first resistive memory element is electrically coupled to the setting terminal of the second resistive memory element.

4. The non-volatile static random access memory according to claim 3, wherein when the data stored in the latch is different from the backup data stored in the backup memory units, the third control transistor and the fourth control transistor of the backup activation units and the sixth control transistor of the backup setting unit are turned on, the data written by the bit line is received by the setting terminal of the first resistive memory element and outputted to the first transmission node of the latch via the resetting terminal of the first resistive memory element; wherein when the data is transmitted to the resetting terminal of the second resistive memory element via the second transmission node, the voltage level on the bit line is 0 V, and the data received by the resetting terminal of the second resistive memory element is outputted to the bit line via the setting terminal of the second resistive memory element.

5. The non-volatile static random access memory according to claim 3, wherein the non-volatile resistive static random access memory further comprises a forming mode before the operating mode, wherein under the forming mode, the first control transistor and the second control transistor are turned on by the signal transmitted by the word line, the sixth control transistor is turned on by the signal transmitted by the restore switch unit, the data written by the complementary bit line is received by the latch via the second transmission node and the data written by the bit line is outputted via the first transmission node, the first control transistor and the second control transistor are turned off, the third control transistor, the fourth control transistor and the fifth control transistor are turned on by the signal transmitted by the backup signal line, the data written by the bit line is transmitted by the sixth control transistor in an ON-state, received by the setting terminal of the first resistive memory element, outputted from the resetting terminal of the first resistive memory element, and transmitted to the first transmission node of the latch via the third control transistor in an ON-state, wherein when the data stored in the latch is different from the data written by the complementary bit line, the data written by the bit line is received by the setting terminal of the second resistive memory element, outputted from the resetting terminal of the second resistive memory element, and transmitted to the second transmission node of the latch via the fourth control transistor in an ON-state, so that the first and second resistive memory elements are in a low resistance state.

6. The non-volatile static random access memory according to claim 5, wherein the first resistive memory element and the second resistive memory element each has a high resistance state and a low resistance state that are state switchable, the first resistive memory element and the second resistive memory element are in the low resistance state when the data is received by the setting terminal of the first resistive memory element and the setting terminal of the second resistive memory element respectively, and the first resistive memory element and the second resistive memory element are in the high resistance state when the data is received by the resetting terminal of the first resistive memory element and the resetting terminal of the second resistive memory element respectively.

7. The non-volatile static random access memory according to claim 6, wherein the first resistive memory element and the second resistive memory element are in the low resistance state under the forming mode.

8. The non-volatile static random access memory according to claim 6, wherein the non-volatile static random access memory further comprises an initiating mode after the forming mode and before the operating mode, wherein after a forming operation and when the data is received by the setting terminal of the first resistive memory element and the setting terminal of the second resistive memory element so that the first resistive memory element and the second resistive memory element are in the low resistance state, the bit line stops writing the data, the data at the first transmission node of the latch is transmitted to the resetting terminal of the first resistive memory element via the third control transistor in the ON-state, outputted from the setting terminal of the first resistive memory element, and transmitted to the bit line via the sixth control transistor in the ON-state, so that the first resistive memory element is switched into the high resistance state.

9. The non-volatile static random access memory according to claim 2, wherein the control switch unit comprises a first power saving transistor, the backup determination unit comprises a second power saving transistor, a third power saving transistor, a fourth power saving transistor, a fifth power saving transistor, a sixth power saving transistor, a seventh power saving transistor, an eighth power saving transistor, a ninth power saving transistor, a tenth power saving transistor and an eleventh power saving transistor, the restore switch unit comprises a twelfth power saving transistor, the first power saving transistor in the control switch unit, the second power saving transistor, the third power saving transistor, the fourth power saving transistor, the fifth power saving transistor, the sixth power saving transistor, the seventh power saving transistor, the eighth power saving transistor, the ninth power saving transistor, the tenth power saving transistor and the eleventh power saving transistor in the backup determination unit and the twelfth power saving transistor in the restore switch unit each has a first source/drain, a second source/drain and a gate, the second, fourth, sixth, eighth, eleventh and twelfth power saving transistors are P-type transistors and the first, third, fifth, seventh, ninth and tenth power saving transistors are N-type transistors, wherein the second sources/drains of the first, third, fifth, seventh and ninth power saving transistors are electrically coupled to the reference voltage, the first sources/drains of the second and fourth power saving transistors are electrically coupled to a first voltage source, the first sources/drains of the sixth and eighth power saving transistors are electrically coupled to a second voltage source, the gates of the tenth and twelfth power saving transistors are electrically coupled to the second voltage source, the gate of the eleventh power saving transistor is electrically coupled to a reversed second voltage source, the gates of the second and third power saving transistors are electrically coupled to the backup signal transmission line, the second source/drain of the second power saving transistor and the first source/drain of the third power saving transistor are electrically coupled to the gates of the fourth and fifth power saving transistors, the second source/drain of the fourth power saving transistor and the first source/drain of the fifth power saving transistor are electrically coupled to the gate of the seventh power saving transistor, the gate of the sixth power saving transistor is electrically coupled to a pre-charging signal, the second source/drain of the sixth power saving transistor and the first source/drain of the seventh power saving transistor are electrically coupled to the gates of the eighth and ninth power saving transistors, the second source/drain of the eighth power saving transistor and the first source/drain of the ninth power saving transistor are electrically coupled to the first sources/drains of the tenth and eleventh power saving transistors, the second sources/drains of the tenth and eleventh power saving transistors are electrically coupled to the backup setting unit, the first source/drain of the twelfth power saving transistor is electrically coupled to a third voltage source, the second source/drain of the twelfth power saving transistor is electrically coupled to the backup setting unit.

10. The non-volatile static random access memory according to claim 9, wherein the node voltage comprises a high level and a low level, the backup determination unit drives the backup setting unit according to the high-level node voltage and stops driving the backup setting unit according to the low-level node voltage.

11. The non-volatile static random access memory according to claim 10, wherein the pre-charging signal is received by the sixth power saving transistor of the backup determination unit under the data backup mode, so that the second source/drain of the sixth power saving transistor and the first source/drain of the seventh power saving transistor are pre-charged a charging voltage by the second voltage source, wherein when the node voltage is in the high level, the third, fourth, seventh, eighth, tenth and eleventh power saving transistors are turned on and the charging voltage is discharged to the reference voltage by the seventh power saving transistor, the second voltage source is outputted to the backup setting unit and the backup setting unit is turned on by the second voltage source, wherein when the node voltage is in the low level, the second, fifth, tenth and eleventh power saving transistors are turned on, and the ninth power saving transistor is turned on by the charging voltage, output of the second voltage source to the backup setting unit is stopped so that the backup setting unit is turned off.

12. The non-volatile static random access memory according to claim 11, wherein the backup determination unit further comprises a feedback inverter, the feedback inverter comprises an input terminal and an output terminal, the input terminal of the backup determination unit is electrically coupled to the first source/drain of the ninth power saving transistor, the output terminal of the backup determination unit is electrically coupled to the second source/drain of the sixth power saving transistor.

13. The non-volatile static random access memory according to claim 9, wherein the twelfth power saving transistor of the restore switch unit is turned on by the second voltage source under the data restore mode, the third voltage source is outputted to the backup setting unit, and the backup setting unit is turned on by the third voltage source.

14. The non-volatile static random access memory according to claim 9, wherein voltage levels of the first, second and third voltage sources are modulated according to a selected manufacturing process.

15. The non-volatile static random access memory according to claim 2, wherein the first resistive memory element and the second resistive memory elements are replaced by non-volatile memory elements.

16. The non-volatile static random access memory according to claim 1, wherein the power saving module is used by the memory cell, the power saving module is configured to determine whether to perform a backup according to a signal transmitted by the backup signal transmission line and perform the backup via the backup setting line, according to which the power saving module is implementable with all circuit structures.

* * * * *